(12) United States Patent
Xu et al.

(10) Patent No.: US 10,309,622 B2
(45) Date of Patent: Jun. 4, 2019

(54) DISPLAY DEVICE

(71) Applicant: BOE TECHNOLOGY GROUP CO., LTD., Beijing (CN)

(72) Inventors: Jian Xu, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/935,154

(22) Filed: Mar. 26, 2018

(65) Prior Publication Data
US 2019/0063728 A1 Feb. 28, 2019

(30) Foreign Application Priority Data
Aug. 28, 2017 (CN) ...................... 2017 2 1089059 U

(51) Int. Cl.
*F21V 17/16* (2006.01)
*H05K 1/18* (2006.01)

(52) U.S. Cl.
CPC ............. *F21V 17/164* (2013.01); *H05K 1/18* (2013.01); *H05K 2201/09063* (2013.01); *H05K 2201/10128* (2013.01); *H05K 2201/10393* (2013.01)

(58) Field of Classification Search
CPC ........ F21V 17/164; H05K 2201/09063; H05K 2201/10393
USPC ....... 362/97.1, 632, 633, 634, 373, 375, 362
See application file for complete search history.

(56) References Cited

U.S. PATENT DOCUMENTS

| | | | | |
|---|---|---|---|---|
| 8,632,200 | B2* | 1/2014 | Takeuchi | G02F 1/133603 362/311.01 |
| 2011/0058118 | A1* | 3/2011 | Kim | G02F 1/133605 349/61 |
| 2012/0092568 | A1* | 4/2012 | Yokota | G02F 1/133605 348/790 |
| 2012/0133845 | A1* | 5/2012 | Ikuta | G02F 1/133608 348/739 |
| 2012/0287376 | A1* | 11/2012 | Zhang | G02F 1/133608 349/64 |
| 2013/0188100 | A1* | 7/2013 | Ikuta | G02F 1/00 348/739 |
| 2016/0033821 | A1* | 2/2016 | Yasuda | G02F 1/133603 349/58 |

* cited by examiner

*Primary Examiner* — Laura K Tso
(74) *Attorney, Agent, or Firm* — Calfee, Halter & Griswold LLP

(57) ABSTRACT

A display device is disclosed, which includes a circuit board having a fixing slot; a backlight module, wherein the backlight module includes a back plate, and the back plate is provided with a circuit board fixing mechanism, and the circuit board fixing mechanism includes a group of holes, a first hole of the group of holes is aligned with the fixing slot; an elastic pressing piece, which is provided with an engaging portion for engaging with the group of the holes and a connecting portion for pressing the circuit board onto the back plate. The engaging portion of the elastic pressing piece passes through the fixing slot of the circuit board and the hole group of the back plate to fix the circuit board onto the backlight module. The fixing method can avoid scratching the circuit board during the fixing process, and the fixing process is simple and convenient.

19 Claims, 4 Drawing Sheets

DISPLAY DEVICE

RELATED APPLICATION

This application claims the benefit of a Chinese Patent Application No. 201721089059.8, filed on Aug. 28, 2017, the entire content of which application is incorporated herein by reference.

FIELD OF THE DISCLOSURE

The present disclosure relates to the field of display technology, and in particular, to a display device.

BACKGROUND OF THE DISCLOSURE

In the display technology, fixing structures for fixing a circuit board to a backlight module may be screws that fix the circuit board on the back plate of the backlight module. On the one hand, a number of screws are not convenient to assembly. On the other hand, the screws are easy to scratch the circuit board during assembling. In addition, clamping fasteners can also be used to assembly. In such structure, the clamping fasteners need to be fixed on the back plate of the backlight module before clamps thereon can be used to clamp and press the circuit board, and the assembling process is complicated and time-consuming.

SUMMARY OF THE DISCLOSURE

The present disclosure provides a display device in which the circuit board and the backlight module are fixed in a manner that avoids damage to the circuit board and the fixing process is simple and time-saving.

To achieve the above object, the present disclosure provides the following technical solutions:

a display device, comprising: a circuit board, which is provided with a fixing slot; a backlight module, which comprises a back plate, wherein the back plate is provided with a circuit board fixing mechanism, the circuit board fixing mechanism comprises a group of holes, a first hole in the group of holes is aligned with the fixing slot; an elastic pressing piece, which is provided with an engaging portion for engaging with the group of holes and a connecting portion for pressing the circuit board onto the back plate.

According to an aspect of the present disclosure, position limiting mechanisms are provided on the circuit board and the back plate of the backlight module respectively to limit the relative positions of the two. When the position limiting mechanisms are aligned, part of the holes in the circuit board fixing mechanism is aligned with the fixing slot. The elastic pressing piece is provided with an engaging portion and a connecting portion, wherein a first engaging portion of the elastic pressing piece is inserted into the fixing slot and the first hole, and a second engaging portion of the elastic pressing piece is inserted into the second hole, so that the circuit board can be engaged with the back plate. In this time the connecting portion of the elastic pressing piece presses the circuit board onto the back plate. In the present disclosure, the circuit board is fixed on the backlight module by engaging, and the assembling by this fixing method is very convenient and will not damage the circuit board.

According to an aspect of the present disclosure, the circuit board is further provided with a first position limiting mechanism, the circuit board fixing mechanism is provided with a second position limiting mechanism cooperating with the first position limiting mechanism, when the first position-limiting mechanism and the second position-limiting mechanism are aligned with each other, the first hole and the fixing slot are also aligned with each other.

According to an aspect of the present disclosure, the circuit board fixing mechanism further comprises a boss fixed on the back plate, and the hole group and the second position limiting mechanism are disposed on the boss.

According to an aspect of the present disclosure, the hole group comprises a first hole and a second hole, the first hole is aligned with the fixing slot, and the engaging portion comprises a first engaging portion passing through the fixing slot to be engaged with the first hole, and a second engaging portion that engages with the second hole.

According to an aspect of the present disclosure, the first hole is elongated, and the second hole is elongated.

According to an aspect of the present disclosure, in the elastic pressing piece, the connecting portion has a rectangular plate-like structure, wherein the first engaging portion includes a fixing wing parallel to the connecting portion and a bent portion connecting the fixing wing and the connecting portion, wherein an angle included by the bent portion and the connecting portion is an acute angle and an opening of the angle is facing the fixing wing to which the bent portion is connected.

According to an aspect of the present disclosure, in the elastic pressing piece, the second engaging portion comprises a fixing wing parallel to the connecting portion and a bent portion connecting the fixing wing and the connecting portion, an angle included by the bent portion and the connecting portion is an acute angle and an opening of the angle is facing the fixing wing to which the bent portion is connected.

According to an aspect of the present disclosure, the second engaging portion further comprises two auxiliary fixing portions at two sides of the bent portion, the auxiliary fixing portions are elongated, and the auxiliary fixings are located at one side of the back plate and the fixing wings of the engaging portion are located at the other side of the back plate to provide the back plate with acting forces in two opposite directions to fix the circuit board onto the back plate.

According to an aspect of the present disclosure, in the second engaging portion, one end of the auxiliary fixing portion is connected to the connecting portion and the other end is provided with a back hook, and the auxiliary fixing portion is attached to the back plate and extends to an edge of the back plate, and the back hook hooks the edge of the back plate.

According to an aspect of the present disclosure, the second position-limiting mechanism comprises a positioning protrusion provided on the back plate, the first position-limiting mechanism comprises a positioning hole provided in the circuit board.

According to one aspect of the disclosure, the elastic pressing piece is a metal pressing piece.

According to one aspect of the present disclosure, a grounding conductive layer is disposed in the fixing slot.

According to an aspect of the present disclosure, the grounding conductive layer is a copper layer.

DETAILED DESCRIPTION OF THE DISCLOSURE

Figure 1:
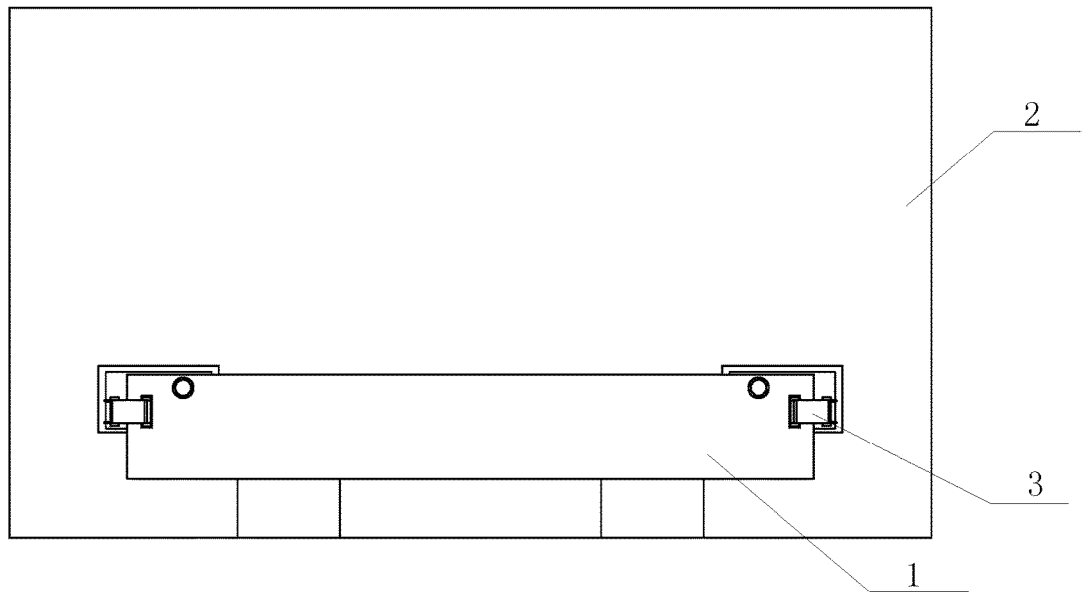
FIG. 1 is a view of a display device according to an embodiment of the present disclosure.
Figure 2:
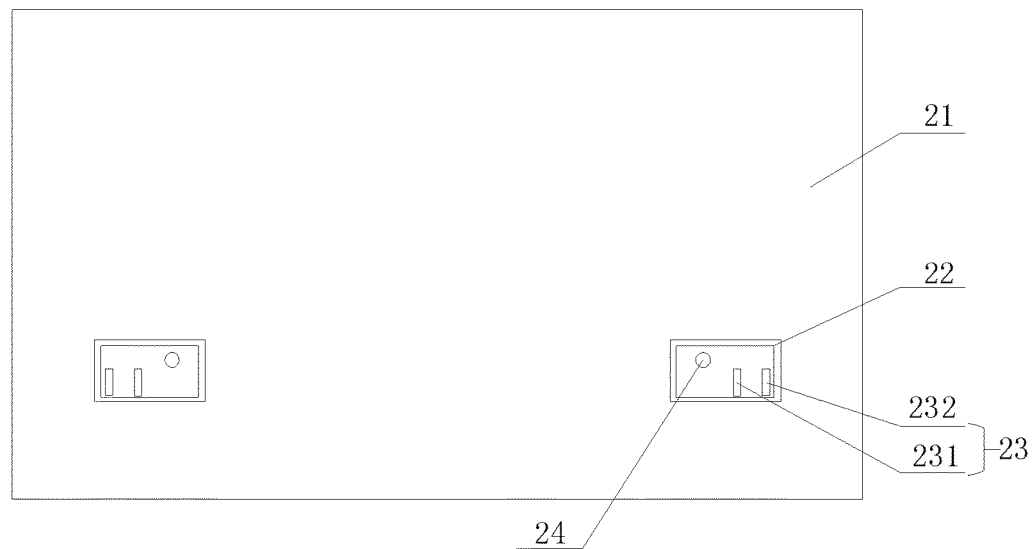
FIG. 2 is a view of a backlight module according to an embodiment of the present disclosure.

The technical solutions in embodiments of the present disclosure are clearly and completely described below with reference to the accompanying drawings in the embodiments of the present disclosure. Apparently, the described embodiments are merely a part but not all of the embodiments of the present disclosure. All other embodiments obtained by a person of ordinary skill in the art based on the embodiments of the present disclosure without creative efforts shall fall within the protection scope of the present disclosure.

As shown in FIG. 1, FIG. 2, FIG. 4 and FIG. 5, a display device according to an embodiment of the present disclosure comprises:

a circuit board 1, which is provided with a fixing slot 12;

a backlight module 2, which comprises a back plate 21, wherein the back plate 21 is provided with circuit board fixing mechanism(s). The circuit board fixing mechanism comprises a group of holes 23, a first hole in the group 23 is aligned with the fixing slot 12;

an elastic pressing piece 3, which is provided with an engaging portion 32 for engaging with the group of holes and a connecting portion 31 for pressing the circuit board 1 onto the back plate 21.

In the above display device, the elastic pressing piece 3 is provided with an engaging portion 32 and a connecting portion 31. A first engaging portion 321 of the elastic pressing piece 3 is inserted into the fixing slot 12 and the first hole 231, and a second engaging portion 322 of the elastic pressing piece 3 is inserted into the second hole 232, so that the circuit board 1 can be engaged with the back plate 21. In this time the connecting portion 31 of the elastic pressing piece 3 is pressed on the back plate 21. In the present disclosure, the circuit board 1 is fixed on the backlight module 2 by engaging, and the assembling by this fixing method is very convenient and will not damage the circuit board.

Furthermore, when the circuit board is fixed to the backlight module, in order to facilitate rapid positioning of the circuit board and the backlight module, position limiting mechanisms are provided on the circuit board body 11 of the circuit board 1 and the back plate 21 of the backlight module 2 respectively to limit the relative positions of the two. When the position limiting mechanism of the circuit board 1 and the position limiting mechanism of the backlight module 2 are aligned, the first hole 231 in the circuit board fixing mechanism is aligned with the fixing slot 12.

The circuit board fixing mechanism further comprises a boss 22 fixed on the back plate 21, and the hole group 23 and the position limiting mechanism are disposed on the boss 22.

The boss 22 is disposed on the back plate 21 to avoid the circuit board 1 from being directly fixed on the back plate 21 to affect the effect of the backlight module 2.

Specifically, there are multiple ways for engaging, which may be specifically as follows:

In a first method, two fixing slots 12 are provided at each end of the circuit board 1. Correspondingly, the hole group 23 provided in the back plate 21 includes two holes corresponding to the two fixing slots 12 one by one. The two fixing slots 12 at each end of the circuit board 1 are engaged with the corresponding two holes by an elastic pressing piece 3, wherein two ends of a connecting portion 31 of the elastic pressing piece 3 are respectively provided with engaging portions 32, the connecting portion 31 is attached to the circuit board 1 and the engaging portions 32 extend into the mating fixing slots 12 and holes to engage and fix the circuit board 1 and the back plate together.

In a second method: a hole group 23 in the back plate 21 includes two holes, and the two holes are respectively located at two ends of the back plate 21. Each end of the circuit board 1 is connected with an elastic pressing piece 3, the connecting portion 31 of the elastic pressing piece 3 is bonded or soldered to the circuit board 1, and the free end of the elastic pressing piece 3 is provided with an engaging portion 32. The engaging portions 32 of the elastic pressing piece 3 at two ends of the circuit board 1 extend into the corresponding holes respectively to engage and fix the circuit board 1 and the back plate together.

Figure 3:
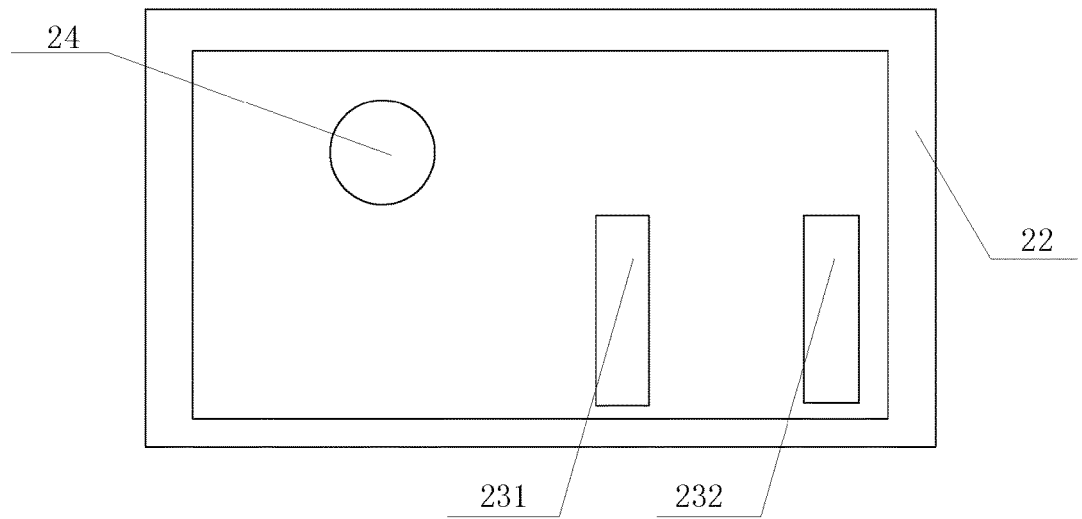
FIG. 3 is an enlarged view of a circuit board fixing mechanism according to an embodiment of the present disclosure.
Figure 4:
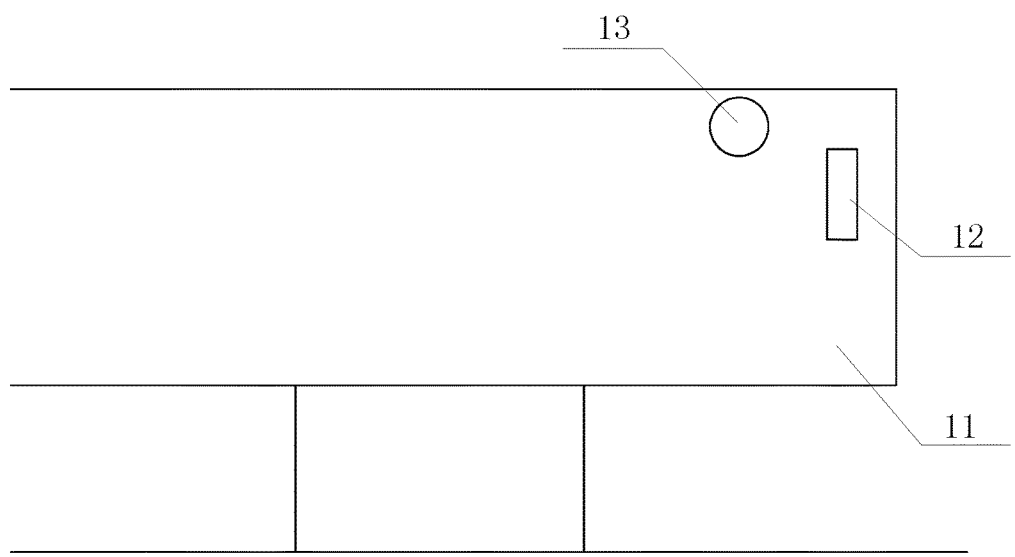
FIG. 4 is a partial enlarged view of a circuit board according to an embodiment of the present disclosure.

In a third method: as shown in FIG. 3, the hole group 23 includes a first hole 231 and a second hole 232. The first hole 231 is aligned with the fixing slot 12. The engaging portion 32 includes a first engaging portion 321 passing through the fixing slot 12 for engaging with the first hole 231 and a second engaging portion 322 for engaging with the second hole 232. As shown in FIG. 1, each end of the circuit board 1 is provided with a fixing slot 12. Each of the fixing slots 12 is engaged by an elastic pressing piece 3, wherein the first hole 231 is aligned with the fixing slot 12. The first engaging portion 321 passes through the fixing slot 12 to be engaged with the first hole 231. The second engaging portion 322 is engaged with the second hole 232. An edge of the circuit board 1 is located between the first hole 231 and the second hole 232. With the engaging method as shown in FIG. 3, the circuit board can be more fixedly engaged, and the circuit board 1 and the back plate 21 are more tightly attached by the pressure of the elastic pressing plate 3.

As shown in FIG. 3, in each circuit board fixing mechanism, the first hole 231 may be elongated, and the second hole 232 may be elongated.

The hole group 23 is elongated, the fabrication process is simple, and the operation is simple and convenient when fixing.

Figure 5:
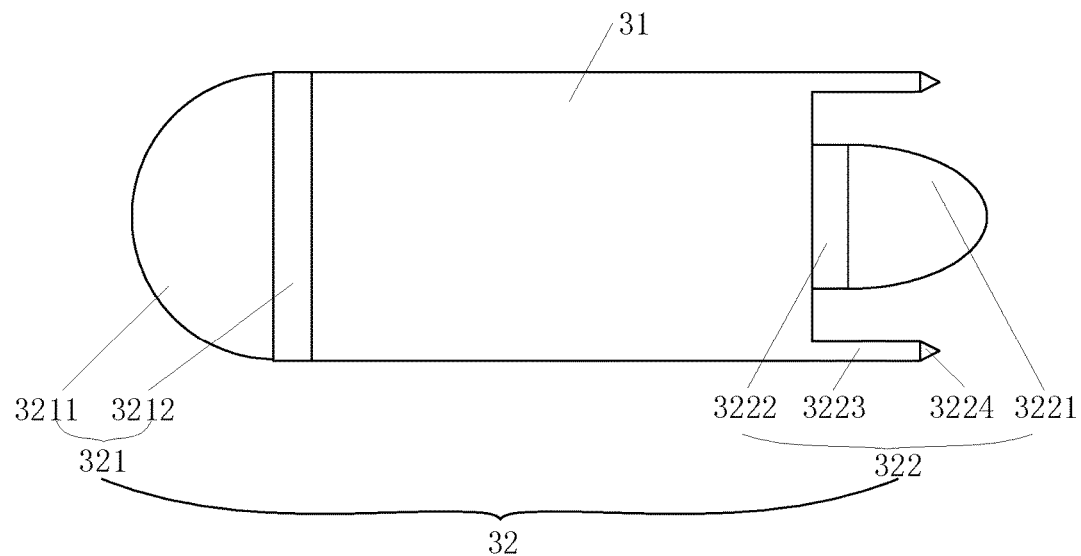
FIG. 5 is an enlarged front view of an elastic pressing piece according to an embodiment of the present disclosure.
Figure 6:
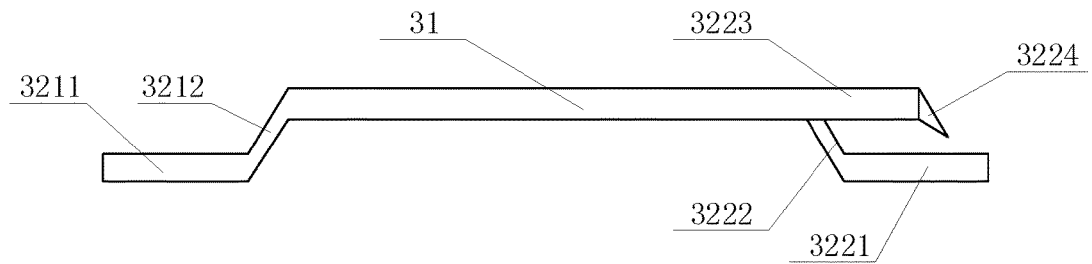
FIG. 6 is an enlarged top view of an elastic pressing piece according to an embodiment of the present disclosure.

Specifically, as shown in FIG. 5 and FIG. 6, in the elastic pressing plate 3, the connecting portion 31 has a rectangular plate-like structure, wherein the first engaging portion 321 includes a fixing wing 3211 parallel to the connecting portion 31 and a bent portion 3212 connecting the fixing wing 3211 and the connecting portion 31, wherein an angle included by the bent portion 3212 and the connecting portion 31 is an acute angle and an opening of the angle is facing the fixing wing 3211 to which the bent portion 3212 is connected. The second engaging portion 322 comprises a fixing wing 3221 parallel to the connecting portion 31 and a bent portion 3222 connecting the fixing wing 3221 and the connecting portion 31. An angle included by the bent portion 3222 and the connecting portion 31 is an acute angle and an opening of the angle is facing the fixing wing 3221 to which the bent portion 3222 is connected.

In the above elastic pressing piece 3, the connecting portion 31 is formed into a rectangular plate-like structure, so that a contact areas between the elastic pressing piece 3 and the circuit board 1 as well as the boss 22 are larger and the attachment is tighter. In consideration of the thickness of the circuit board, a bent portion 3211 and a bent portion 3222 are provided, so that the attaching effect between the elastic pressing piece 3 and the circuit board is better, achieving better pressing and fixing effect.

Further, as shown in FIGS. 5 and 6, the second engaging portion 322 further comprises two auxiliary fixing portions 3223 at two sides of the bent portion 3222, the auxiliary fixing portions 3223 each are elongated. After the circuit board is fixed to the backlight module by the elastic pressing piece 3, the auxiliary fixing portions 3223 are located at one side of the back plate 21, and the fixing wing 3211 and the fixing wing 3221 of the engaging portion 32 are located at the other side of the back plate 21 so as to provide the back plate 21 with two opposite forces to fix the circuit board to the back plate 21.

In the second engaging portion 322, the auxiliary fixing portion 3223 cooperates with the fixing wing 3221 to provide the back plate 21 with two opposite forces to fix the circuit board 1 and the back plate 21, which can make the fixing firmer.

Figure 7:
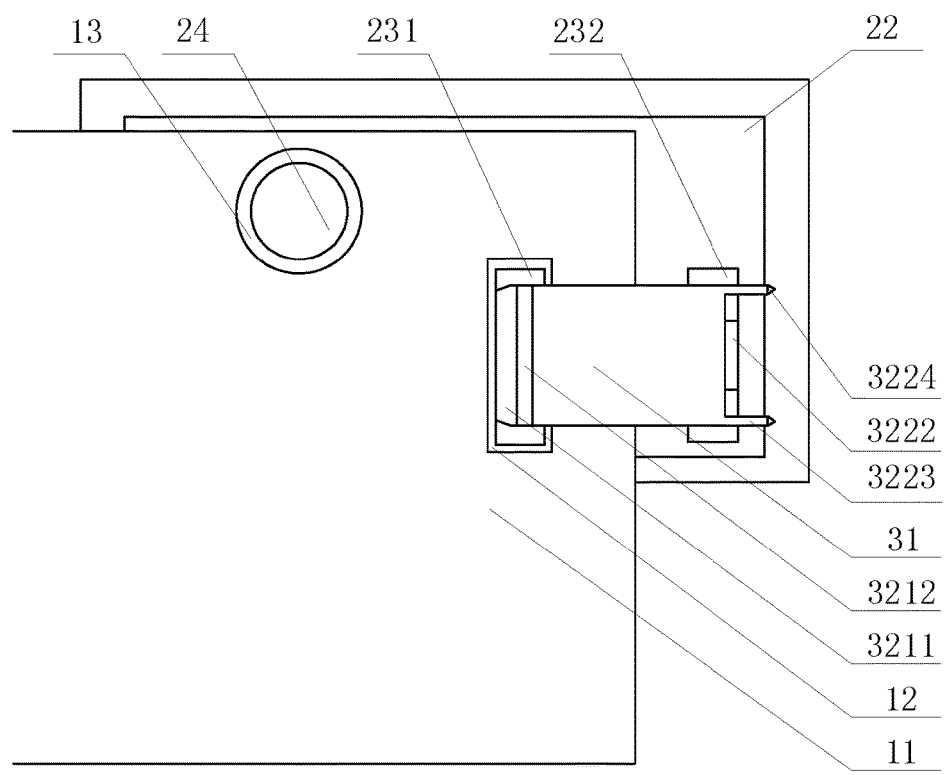
FIG. 7 is a view of a display device fixed by an elastic pressing piece according to an embodiment of the present disclosure.

Specifically, as shown in FIG. 7, one end of the auxiliary fixing portion 3223 is connected to the connecting portion 31 and the other end is provided with a back hook 3224, and the auxiliary fixing portion 3223 is attached to the back plate 21 and extends to an edge of the back plate 21, and the back hook 3224 hooks the edge of the back plate 21. The back hook 3224 secures the back plate 21 from the other direction so that the fixing effect of the circuit board 1 and the back plate 21 is better.

Specifically, as shown in FIG. 7, the position-limiting mechanism comprises a positioning protrusion 24 provided on the back plate 21, and a positioning hole provided in the circuit board for cooperating with the positioning protrusion 24.

The position limiting mechanism can make the fixing of the circuit board 1 and the back plate 21 more convenient and quick. Aligning the positioning hole 13 in the circuit board 1 with the positioning protrusion 24 on the back plate 21 can make the first hole 231 of the back plate 21 align with the fixing slot 12 of the circuit board 1 at the same time so as to set the relative positions of the circuit board 1 and the back plate 21 very accurately and simplify. The fixing step is simple and the operation is very easy.

Specifically, the elastic pressing piece 3 is a metal pressing piece.

The elastic pressing piece 3 is made of a metal pressing piece because on one hand it is electrically conductive and on the other hand metal has ductility so that it can be easily inserted into the first hole 231 of the aligned back plate 21 and the fixing slot 12 of the circuit board 1.

Specifically, a grounding conductive layer is disposed in the fixing slot 12.

The fixing slot 12 of the circuit board 1 is connected with the back plate 21 through the elastic pressing piece 3, and the grounding conductive layer is disposed in the fixing slot 12 so that the circuit board 1 and the back plate 21 are grounded at the same time.

Specifically, the grounding conductive layer is a copper layer.

The grounding conductive layer is a copper layer, which can achieve good conductivity and also save cost.

Obviously, those skilled in the art can make various modifications and variations to the embodiments of the present disclosure without departing from the spirit and scope of the disclosure. In this way, if these modifications and variations of the disclosure fall within the scope of the claims of the disclosure and the equivalent technologies, the disclosure is also intended to include these modifications and variations.

The invention claimed is:

1. A display device, comprising:
a circuit board, which is provided with a fixing slot;
a backlight module, which comprises a back plate and a circuit board fixing mechanism arranged on the back plate, wherein the circuit board fixing mechanism comprises a first hole;
an elastic pressing piece, which is provided with an engaging portion for engaging with the first hole and a connecting portion for pressing the circuit board onto the back plate,
wherein the circuit board comprises a first position limiting mechanism, the circuit board fixing mechanism comprises a second position limiting mechanism adapted to cooperate with the first position limiting mechanism, when the first position limiting mechanism and the second position-limiting mechanism are aligned with each other, the first hole and the fixing slot are also aligned with each other.

2. The display device according to claim 1, wherein the circuit board fixing mechanism further comprises a boss, and the first hole and the second position limiting mechanism are disposed on the boss.

3. The display device according to claim 1, wherein the circuit board fixing mechanism comprises a first hole and a second hole, the first hole is aligned with the fixing slot, and the engaging portion comprises: a first engaging portion passing through the fixing slot to be engaged with the first hole; and a second engaging portion that engages with the second hole.

4. The display device according to claim 3, wherein the first hole is elongated, and the second hole is elongated.

5. The display device according to claim 3, wherein in the elastic pressing piece, the connecting portion has a rectangular plate-like structure, wherein the first engaging portion includes a fixing wing parallel to the connecting portion and a bent portion connecting the fixing wing and the connecting portion, wherein an angle included by the bent portion and the connecting portion is an acute angle and an opening of the angle is facing the fixing wing to which the bent portion is connected.

6. The display device according to claim 5, wherein in the elastic pressing piece, the second engaging portion comprises a fixing wing parallel to the connecting portion and a bent portion connecting the fixing wing and the connecting portion, an angle included by the bent portion and the connecting portion is an acute angle and an opening of the angle is facing the fixing wing to which the bent portion is connected.

7. The display device according to claim 6, wherein the second engaging portion further comprises two auxiliary fixing portions at two sides of the bent portion, the auxiliary fixing portions are elongated, and the auxiliary fixing portions are located at one side of the back plate, while the fixing wings of the engaging portion are located at the other side of the back plate to provide the back plate with acting forces in two opposite directions to fix the circuit board onto the back plate.

8. The display device according to claim 7, wherein in the second engaging portion, one end of the auxiliary fixing portion is connected to the connecting portion and the other end is provided with a back hook, and the auxiliary fixing portion is attached to the back plate and extends to an edge of the back plate, and the back hook hooks the edge of the back plate.

9. The display device according to claim 1, wherein the second position limiting mechanism comprises a positioning protrusion, the first position limiting mechanism comprises a positioning hole.

10. The display device according to claim 1, wherein the elastic pressing piece is a metal pressing piece.

11. The display device according to claim 1, wherein a grounding conductive layer is disposed in the fixing slot.

12. The display device according to claim 11, wherein the grounding conductive layer is a copper layer.

13. The display device according to claim 2, wherein the second position limiting mechanism comprises a positioning protrusion, the first position limiting mechanism comprises a positioning hole.

14. The display device according to claim 3, wherein the second position limiting mechanism comprises a positioning protrusion, the first position limiting mechanism comprises a positioning hole.

15. The display device according to claim 4, wherein the second position limiting mechanism comprises a positioning protrusion, the first position limiting mechanism comprises a positioning hole.

16. The display device according to claim 5, wherein the second position limiting mechanism comprises a positioning protrusion, the first position limiting mechanism comprises a positioning hole.

17. The display device according to claim 6, wherein the second position limiting mechanism comprises a positioning protrusion, the first position limiting mechanism comprises a positioning hole.

18. The display device according to claim 7, wherein the second position limiting mechanism comprises a positioning protrusion, the first position limiting mechanism comprises a positioning hole.

19. The display device according to claim 8, wherein the second position limiting mechanism comprises a positioning protrusion, the first position limiting mechanism comprises a positioning hole.

* * * * *